United States Patent [19]
Bates

[11] Patent Number: 6,008,994
[45] Date of Patent: Dec. 28, 1999

[54] PC CARD GROUNDING CLIP

[75] Inventor: Charles Linsday Bates, Laguna Hills, Calif.

[73] Assignee: ITT Manufacturing Enterprises, Inc., Wilmington, Del.

[21] Appl. No.: 09/128,688

[22] Filed: Aug. 4, 1998

[51] Int. Cl.[6] ............................... H05K 1/14; H05K 9/00
[52] U.S. Cl. ..................... 361/737; 361/728; 361/736; 361/753; 361/818; 439/946
[58] Field of Search ................................ 361/728, 736, 361/737, 753, 799, 796, 816, 818; 439/945–946, 76.1, 95; 174/35 R, 35 GC, 51

[56] References Cited

U.S. PATENT DOCUMENTS

| | | | |
|---|---|---|---|
| 5,081,696 | 1/1992 | Beck | 392/449 |
| 5,490,043 | 2/1996 | Tan et al. | 361/818 |
| 5,537,294 | 7/1996 | Siwinski | 361/753 |
| 5,563,450 | 10/1996 | Bader et al. | 257/785 |
| 5,564,933 | 10/1996 | Bouchan et al. | 439/76.1 |
| 5,603,620 | 2/1997 | Hinze et al. | 439/95 |
| 5,653,596 | 8/1997 | Banakis et al. | 439/64 |
| 5,673,181 | 9/1997 | Hsu | 361/760 |
| 5,696,669 | 12/1997 | Bassler et al. | 361/816 |
| 5,749,741 | 5/1998 | Bellas et al. | 439/95 |
| 5,754,404 | 5/1998 | Biermann et al. | 361/737 |
| 5,780,365 | 7/1998 | Nogami | 439/76.1 |
| 5,896,274 | 4/1999 | Ishida | 361/737 |
| 5,920,460 | 7/1999 | Oldendorf et al. | 361/753 |

*Primary Examiner*—Donald Sparks
*Assistant Examiner*—Tuan Dinh
*Attorney, Agent, or Firm*—Thomas L. Peterson

[57] ABSTRACT

A grounding clip (130, 132) is provided which mounts on a rear end cap (60) of a PC card, and which connects a rear connector shell (44) of the PC card to a top 5 sheet metal cover portion (90). The clip has a pair of top spring fingers (140, 142) that lie in recesses (150) in the top surface of the top flange (62) of the rear end cap, and has a bottom finger (144) lying against the lower surface of the top flange and against a tine (104) formed in the shell of the rear connector. The clip lies close to an extreme side (124,126) of the PC card, to remain engaged with the top cover portion despite bending of the cover rear portion that results in its middle (126) being raised above its opposite sides.

10 Claims, 3 Drawing Sheets

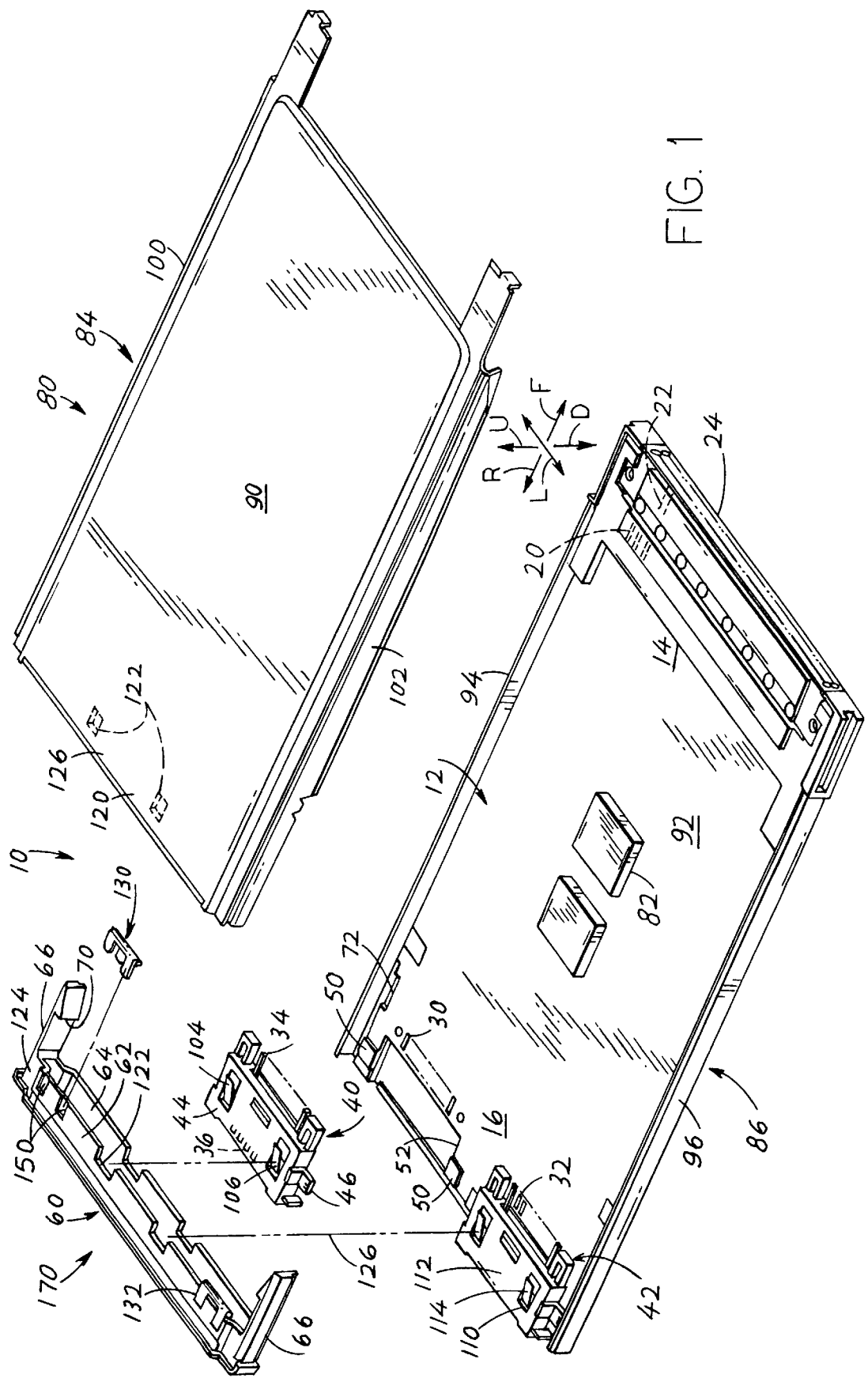

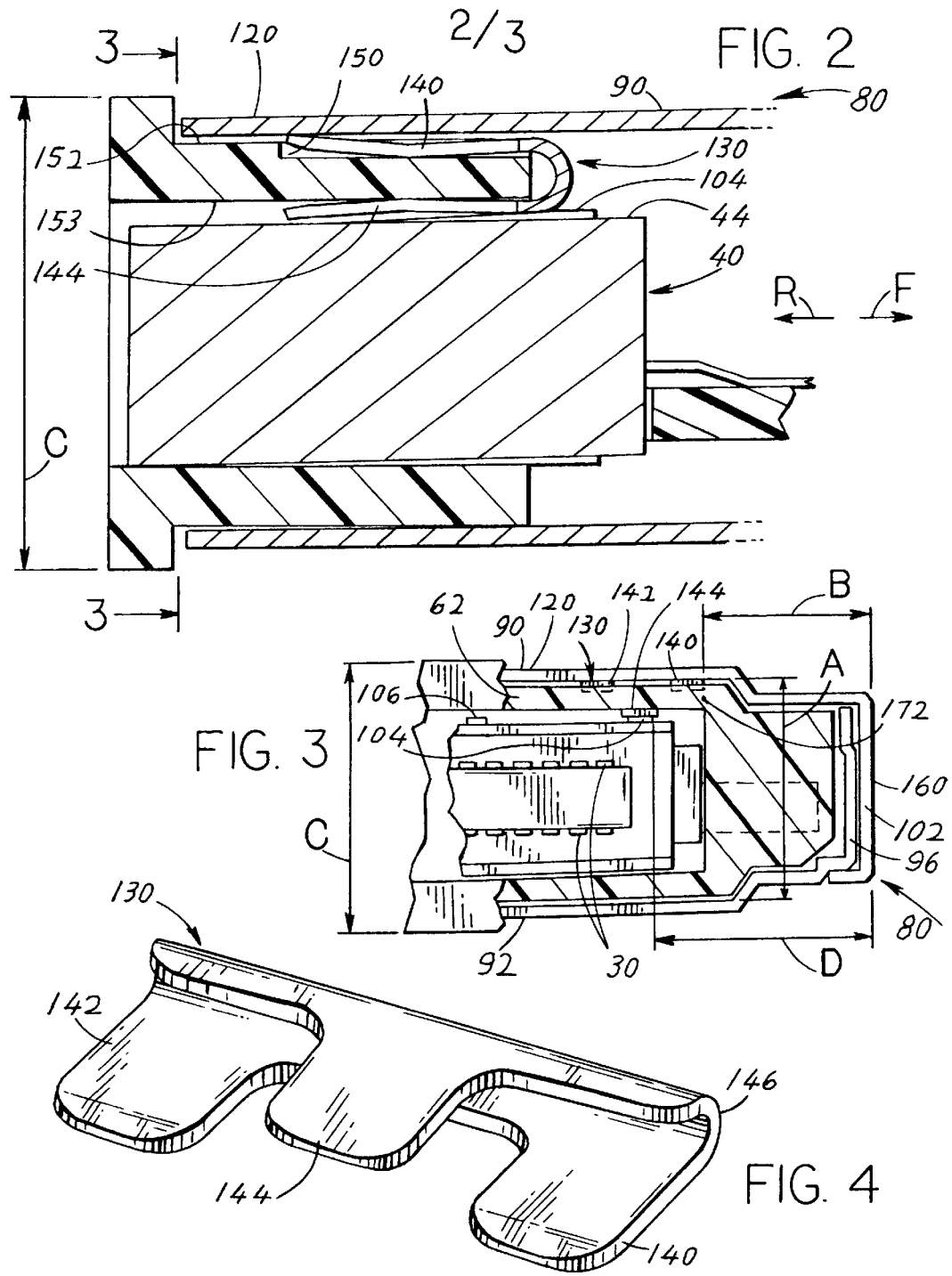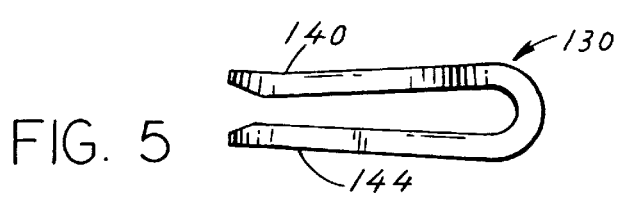

PC CARD GROUNDING CLIP

BACKGROUND OF THE INVENTION

PC cards (a card with a "printed circuit" board) are cards that may be of the type specified under PCMCIA (Personal Computer Memory Card International Association), or of the type commonly referred to as form factor cards which are small and used in cameras to store images, or of other types that have circuit boards with traces thereon connected to contacts of a connector.

One type of PC card, such as shown in U.S. Pat. No. 5,754,404, includes a pair of rear connectors at the rear of the circuit board, which fit between top and bottom flange walls of a plastic rear end cap. The rear connectors have sheet metal shells that are soldered to a ground conductor on the circuit board and that must be connected to a sheet metal cover that surrounds the PC card to ground the cover. Such grounding is achieved by forming cutouts in the flanges of the cap, and by forming the rear connector shells with tines that extend through the cutouts and directly engage depressions in the sheet metal cover. The cutouts in the flanges of a rear end cap lie close to the middle of the width of the end cap to avoid weakening the opposite sides. It is found that, in practice, there is poor connection between the connector shell tines and the sheet metal cover. A PC card with at least one rear connector, which established secure contact between the shell of a rear connector and the sheet metal cover, in a simple and low-cost manner that facilitated PC card assembly, would be of value.

SUMMARY OF THE INVENTION

In accordance with one embodiment of the present invention, a simple but effective means is provided for connecting the shell of a rear connector of a PC card to the sheet metal cover of the card. The means induces a sheet metal clip having spring fingers that allow it to clip to a top flange of the rear end cap of the card, at a location close to a side of the cover. A lower finger of the dip engages the shell of the rear connector, preferably at a tine thereat, while an upper finger of the clip directly engages a rear part of the cover top portion near a side of the cover.

The upper surface of the top flange of the rear end cap preferably has recesses that receive top spring fingers of the clip, so the clip projects only slightly above the top flange to allow the sheet metal cover to lie closely facewise adjacent to the top flange. The distance between the clip and an adjacent side of the cover, where top and bottom cover halves are fixed, is preferably no more than 140 percent of the maximum height of the rear end cap.

The novel features of the invention are set forth with particularity in the appended claims. The invention will be best understood from the following description when read in conjunction with the accompanying drawings.

BRIEF DESCRIPTION OF THE DRAWINGS

FIG. 1 is an exploded isometric view of a PC card constructed in accordance with the present invention.

FIG. 2 is a sectional view of the rear end of the PC card of FIG. 1.

FIG. 3 is a view taken on line 3—3 of FIG. 2.

FIG. 4 is an upsidedown isometric view of the clip of FIG. 1.

FIG. 5 is a side elevation view of the clip of FIG. 4.

DESCRIPTION OF THE PREFERRED EMBODIMENTS

Figure 6:
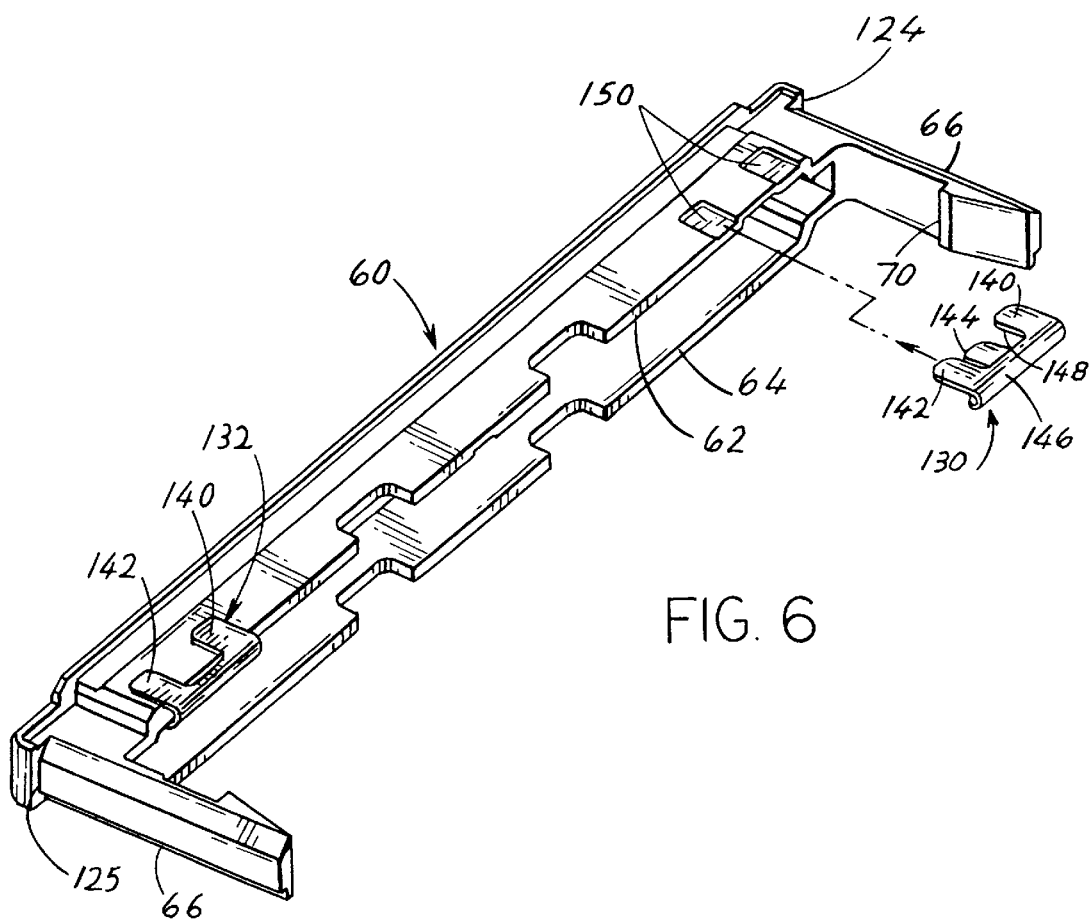
FIG. 6 is an enlarged isometric view of the end cap and clip of FIG. 1.

FIG. 1 illustrates a PC card 10 which is a Type II PC card under PCMCIA standards, that has a length in forward and rearward directions F, R of about 86 mm, a width in a lateral direction L of about 54 mm, and a maximum thickness in vertical directions U, D of 5 mm. The card includes a circuit board 12 having front and rear ends 14, 16 with a row of conductive traces at each end. A front row of conductive traces 20 is connected to tails of socket contacts 22 that are mounted in a front connector 24. A pair of rear rows 30, 32 of conductive traces are connected to tails 34 of contacts 36 of each of a pair of rear connectors 40, 42. Each rear connector has a sheet metal shell 44 with mounting tabs 46 that are soldered to a ground conductor 50 at the rear of the circuit board. It is noted that the shell lies in a hole 52 formed at the rear of the circuit board and extends above and below the circuit board thereat. A rear end cap 60 closes the rear end of the PC card. The rear end cap has top and bottom flanges 62, 64, and each connector 40, 42 is closely received between the flanges. It is noted that the cap has arms 66 at its laterally opposite sides, with the arms having latches 70 that hook into cutouts 72 in the circuit board. A sheet metal cover 80 surrounds the circuit board to mechanically protect it and to isolate electronic components such as 82 from electromagnetic interference from outside sources while protecting circuits in a computer or the like from emissions originating from the electronic components.

The cover 80 includes upper and lower cover halves 84, 86. Each cover half has top primarily planar top and bottom portions 90, 92. The bottom cover half has a pair of upstanding side rails 94, 96, that are joined to corresponding depending side rails 100, 102 of the upper cover half. Applicant's FIG. 3 shows one manner in which a pair of side rails 96, 102 are connected in a joint that fixes the vertical distance A between the top and bottom cover planar portions 90, 92. It is noted that the side rail 96, 102 may also be bonded together as by solder or welding.

As shown in FIG. 1, the sheet metal shells 44 of the rear connectors 40, 42 each have a pair of tines 104, 106 with rear ends 110 that merge with the main portion 112 of the shell and with free front ends 114. The tines extend at an upward-forward incline but can be resiliently depressed. In the prior art, the rear end 120 of the top planar part 90 of the cover was provided with depressions or dimples 122 for directly engaging one of the tines 104, 106 of each of the rear connector shells. The rear end cap was formed with a top flange 62 having cutouts 122 into which the dimples sit to bring them closer to the fines 104, 106 of the rear connector shells. The cutouts 122 had to be placed closer to the lateral middle of the cap rather than the sides of the cap, to avoid weakening the sides of the flange. The sides 124, 125 of the rear end cap are subjected to higher stresses than the middle, and should not be weakened. In practice, it was found that there was not reliable low resistance connections between the tines and the dimples 122, resulting in poor EMI (electromagnetic interference) shielding. One major cause for poor connections was that the rear end 120 of the top planar portion 90 often lay in a bowed shape, commonly referred to as a "smile", resulting in the middle being raised. It is noted that each rear end connector was provided with two tines, so the tine lying closest to the middle of the card width lay under a cutout 122, as indicated by vertical line 126.

In accordance with the present invention, applicant provides a pair of electrically conductive clips 130, 132 to electrically connect the sheet metal shells 44 of the rear end connectors to the rear end 120 of the top planar portion 90 of the cover. As shown in FIG. 6, each clip has a pair of top spring fingers 140, 142 and a bottom spring finger 144, with these spring fingers being connected by a base 146. There is a gap 148 between the top spring fingers, and the bottom finger 144 lies directly below the gap. The top flange 62 has an upper surface 152 with a pair of recess portions 150, and each top finger 140,142 lies on the upper surface of the top flange in a recess portion 150, while the bottom finger 144 lies against the lower surface 153 of the top flange. As shown in FIG. 2, the top spring finger 140 extends slightly above the main portion 152 of the top flange upper surface, to directly engage the rear end 120 of the cover top planar portion 90. The tine 104 of the sheet metal shell 44 of the rear connector 40 engages the bottom spring finger 144. Thus, a grounding connection between the cover 80 and the rear connector shell 44 is made through the clip 130.

FIG. 3 is a view taken on line 3—3 of FIG. 2, with the projecting portions of the top spring fingers 140, 142 and the bottom spring finger 144 being shown. The clip 130 is placed close to the extreme side 160 of the cover 80, which is about where the extreme side of the rear end cap lies. The small lateral spacing B results in the top spring finger such as 140 lying against a location on the cover rear end 120 that is at a stable height, as compared to the middle of the cover rear portion which can lie much higher if the cover has a "smile". This is due to the fact that the side rails 96, 102 of the cover are fixed together so their height does not vary, and so the height of the cover rear end at the top spring finger 140 does not vary substantially.

As shown in FIG. 1, applicant prefers to provide two clips 130, 132 on the top flange 62. Applicant also may provide one or two dips that are similarly clipped onto the bottom flange 64 of the rear end cap. It is noted that some PC cards have only a single rear connector in which case only one clip is required for each flange, or only one clip for one flange. It is noted that the recess portions 150 for the clips also provide an indication as to where the clips should be mounted, and resist movement of the clips.

The PC cards are commonly assembled by a manufacturer who manufactures only the circuit board 12 and assembles components 82 on the circuit board. A PC kit 170 is commonly made by a manufacturer who sells the kit to the company that makes the circuit board and that assembles the kit and circuit board to make the card. The kit includes the front and rear connectors 24, 40, 42, the rear end cap 60, the cover halves 84, 86, and the clips 130, 132. Sometimes the company that assembles the components purchases the rear end connectors 40, 42 from a different source. Applicant makes such PC kits and supplies the clips 130, 132 along with the cover halves, assuring that the clips and cover halves are formed of compatible metal that will not result in electrolytic action that causes corrosion. Applicant also supplies the rear end cap 60 with the clips 130, 132 already installed to avoid additional loose parts that might be lost and that must be installed.

In a PC card that applicant has designed and constructed, the clip lay (FIG. 3) at the extreme side 172 of the top flange 62 (preferably no more than 2 mm therefrom), with the distance B between the extreme side 160 of the card and the clip being 0.19 inch (4.8 mm). This is about equal to the height C of 4.8 mm of the card and of the rear end cap. The lower finger 144 and sheet metal shell tine 104 lay a distance D of 7.2 mm from the extreme side 160 of the card. Applicant prefers that the distance B be less than the distance D, so that the spacing B of the clip from the side is no more than 140% of the distance of the tine 104 from the extreme side of the card. It is noted that while the tine 104 was present in the prior art, only the furthest tine 106 was used to make a ground connection.

While applicant has used terms such as "upper" and "lower" to aid in understanding the invention as illustrated, it should be understood that the PC card and its parts can be used in any orientation with respect to the Earth.

Thus, the invention provides a PC card and a kit therefor, of the type wherein one or two rear connectors are mounted at the rear of the circuit board and are closely received between top and bottom flanges of a rear end cap, which provides reliable grounding connection between a shell of a rear connector and the sheet metal cover of the card. A sheet metal clip is clipped onto a flange of the cap, such as the top flange, with a bottom finger of the clip that lies under the top flange engaging the sheet metal shell, and with an upper finger of the dip directly engaging the rear end of the top planar portion of the sheet metal cover. The clips lie close to an extreme side of the rear end cap and of the sheet metal cover where side rails of top and bottom cover halves are joined, to avoid requiring contact only with the middle of the rear end where "smiling" of the cover could cause lack of engagement of the clip with the cover. The bottom spring finger preferably engages a tine formed in the rear connector shell.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. In a PC card with a circuit board having front and rear board ends and at least one row of conductive traces at each end, where said circuit board has a ground conductor, where said PC card includes front and rear connectors at said front and rear board ends with contacts of each connector connected to traces of a corresponding one of said rows, wherein said PC card includes a sheet metal cover with largely planar top and bottom portions, wherein said rear connector has a sheet metal shell that is electrically joined to said ground conductor and that includes a shell top wall, and wherein said PC card has a rear end cap with top and bottom flanges that receive said shell of said rear connector between them, with each flange having top and bottom surfaces, the improvement comprising:

a metal dip having a plurality of spring fingers including top and bottom spring fingers lying respectively against the top and bottom surfaces of said top flange to grasp said flange between them, said clip having a base connecting said spring fingers, with at least one bottom spring finger engaging said sheet metal shell and with at least one top spring finger engaging said planar top portion of said sheet metal cover.

2. The PC card described in claim 1 wherein:

said cover includes upper and lower cover halves that each have lateral opposite sides, with adjacent pairs of said opposite sides being mechanically and electrically joined together to form joined first and second laterally opposite cover sides;

said top flange has extreme opposite sides, and said clip lies at one of said top flange extreme sides, so said dip engages a top cover location close to one of said cover sides.

3. The PC card described in claim 1 wherein:

said sheet metal cover has a first side and said clip has a side spaced from said first sheet metal cover side by substantially no more than the maximum height of said end cap.

4. The PC card described in claim 1 wherein:

said clip has two laterally-spaced top spring fingers, with a gap between them, and said bottom spring finger lies directly under said gap;

said top surface of said top flange has a pair of recess portions that each receives part of the thickness of one of said top spring fingers.

5. The PC card described in claim 1 wherein:

said shell top wall includes a sheet-like main top wall part and a tine with a first end merging with said main top wall part and with an opposite free end, and said bottom spring finger engages said fine at a location spaced from said first line first end.

6. The PC card described in claim 1 wherein:

said PC card is constructed in accordance with PCMCIA specifications for Type II cards wherein the length, width, and height of the card are about 86 mm, 54 mm and 5 mm, respectively, and said rear end cap has said height of about 5 mm and said width of about 54 mm and has opposite cap sides;

said clip is spaced from an extreme side of said cap by a distance (B) that is no more than 140% of the height (C) of said end cap.

7. A PC card kit for use with a circuit board that has a ground trace, to form a PC card which includes a plastic molded rear end cap having vertically spaced upper and lower flanges, said PC card kit including a sheet metal cover comprising upper and lower cover halves with top and bottom cover sheet parts lying directly over and under said flanges, cover sides of predetermined heights that are joinable to vertically space said cover sheet parts by a predetermined distance, and at least one rear connector that has a metal shell with a portion for soldering to said ground trace on said circuit board, with said shell being of a height to be received between said flanges, including:

a sheet metal clip that has top and bottom spring fingers and that is clipped to said upper flange at a location directly above said shell, with said clip bottom finger engaging said shell and a lower surface of said upper flange while said top spring finger engages said top cover sheet part.

8. The PC card described in claim 7 wherein:

said clip has two laterally-spaced top spring fingers, with a gap between them, and said bottom spring finger lies directly under said gap;

said top surface of said top shroud wall has a pair of recess portions that each receives part of the thickness of one of said top spring fingers.

9. The PC card described in claim 7 wherein:

said shell top wall includes a sheet-like main top wall part and a tine with a first end merging with said main top wall part and with an opposite free end, and said bottom spring finger engages said fine at a location spaced from said first tine end.

10. The PC card described in claim 7 wherein:

said top flange has an extreme side and said clip lies at said extreme side.

\* \* \* \* \*